(12) United States Patent
Koyama et al.

(10) Patent No.: US 7,650,692 B2
(45) Date of Patent: Jan. 26, 2010

(54) METHOD FOR MOUNTING ELECTRONIC-COMPONENT MODULE

(75) Inventors: Kunihiro Koyama, Otsu (JP);
Muneyoshi Yamamoto, Moriyama (JP);
Takanori Uejima, Moriyama (JP); Dai Nakagawa, Moriyama (JP); Masaki Kimura, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/052,087

(22) Filed: Mar. 20, 2008

(65) Prior Publication Data

US 2008/0192447 A1    Aug. 14, 2008

Related U.S. Application Data

(63) Continuation of application No. PCT/JP2006/315051, filed on Jul. 28, 2006.

(30) Foreign Application Priority Data

Sep. 22, 2005   (JP) ............... 2005-276572

(51) Int. Cl.
*H05K 3/30* (2006.01)
(52) U.S. Cl. .............. 29/832; 29/840; 29/841; 29/852; 428/209
(58) Field of Classification Search ........... 29/832, 29/840, 841, 852; 428/209
See application file for complete search history.

(56) References Cited

U.S. PATENT DOCUMENTS

2005/0233122 A1*   10/2005   Nishimura et al. .......... 428/209

FOREIGN PATENT DOCUMENTS

| JP | 05-190380 A | 7/1993 |
|---|---|---|
| JP | 2000-77604 A | 3/2000 |
| JP | 2002-261581 A | 9/2002 |
| JP | 2003-124701 A | 4/2003 |

OTHER PUBLICATIONS

Official communication issued in counterpart International Application No. PCT/JP2006/315051, mailed on Aug. 22, 2006.

* cited by examiner

*Primary Examiner*—C. J Arbes
(74) *Attorney, Agent, or Firm*—Keating & Bennett, LLP

(57) ABSTRACT

A suction surface member is provided on an electronic component module including an electronic component base plate and surface mount device mounted on the electronic component base plate in order to provide a suction surface at a location that is substantially at the same level as or higher than that of an upper end of a transistor that is the tallest surface mount device. The suction head adheres to the suction surface to hold the electronic component module and the electronic component module is mounted on a motherboard defining the target board. Then a treatment is performed to prevent a situation in which an upper end of the suction surface member is higher than the upper end of the tallest surface mount device mounted on the electronic component base plate.

7 Claims, 10 Drawing Sheets

METHOD FOR MOUNTING ELECTRONIC-COMPONENT MODULE

BACKGROUND OF THE INVENTION

1. Field of the Invention

The present invention relates to a method for mounting an electronic component module, a method for manufacturing an electronic apparatus using the method for mounting an electronic component module, and an electronic component module. Specifically, the present invention relates to a method for mounting an electronic component module which is mounted in a process in which a suction head holds the electronic component module by suction while the module is being placed on a target board, a method for manufacturing an electronic apparatus using the method for mounting an electronic component module, and an electronic component module applicable to these methods.

2. Description of the Related Art

FIG. 11 shows a conventional electronic component module. As shown in FIG. 11, an electronic component module 61 includes an electronic component base plate 51, which is made of a ceramic plate or other suitable material, having terminal electrodes 53 on a lower surface thereof and surface mount devices (SMDs) 52 (for example, a capacitor 52a, a resistor 52b, a transistor 52c, and a coil 52d) on an upper surface thereof and a metal case 56 having a flat top surface covering the upper surface of the electronic component base plate 51 having the surface mount devices 52 thereon. Various electronic component modules having a structure similar to the electronic component module 61 shown in FIG. 11 have been provided (refer to Japanese Unexamined Patent Application Publication No. 5-190380), and the structure shown in FIG. 11 is well known.

Here, the metal case 56, which is used in the above-mentioned electronic component module 61, has the following two main functions:

(a) providing an electromagnetic shield that reduces an electromagnetic influence of the surface mount devices 52 on other electronic apparatuses and an electromagnetic influence of other electronic apparatuses on the surface mount devices 52; and (b) providing a suction surface 54 (shown in FIG. 13) that is used to provide a suction force to the electronic component module 61 with a suction head 62 (shown in FIG. 13), which is prepared for mounting components. That is, the flat top surface of the metal case 56 defines the suction surface 54.

Furthermore, as shown in FIG. 12, an electronic component module 61a having a molded resin 57, which is used instead of the metal case 56 to seal the surface mount devices 52, is known. In such a case, a top surface 57a of the molded resin 57 defines the suction surface 54. Note that, in FIG. 12, the same reference numerals as used in FIG. 11 denote portions corresponding to those shown in FIG. 11.

When the above-mentioned electronic component module 61 (shown in FIG. 11) is mounted on a motherboard 55, which is a target board, mounting is performed according to the following procedure (refer to FIGS. 13 and 14).

As shown in FIG. 13, a top surface, which defines a suction surface 54, of a metal case 56 of the electronic component module 61 is subjected to a suction force with a suction head 62.

The electronic component module 61 is held with the suction head 62 and conveyed to a location over the target board, that is, the motherboard 55. Then the electronic component module 61 is disposed on predetermined land electrodes 65 on which soldering paste 64 is printed in advance (shown in FIG. 14).

Then, the motherboard 55 is fed into a reflow oven and heated under predetermined conditions so as to melt the soldering paste 64. Then, the electronic component module 61 is fixed on the land electrodes 65 of the motherboard 55 with solder 64a.

Recently, however, with improvements in the performance of surface mount devices and shielding performance of electronic apparatuses, the above-mentioned function (a) of the metal case has not been required.

Furthermore, recently, electronic apparatuses, such as portable phones have been miniaturized, and accordingly, a reduction in the height of the electronic component module to be used in such electronic apparatuses has become increasingly necessary.

However, when a conventional electronic component module is mounted as shown in FIG. 14, since a gap G is required between a lower surface of a metal case 56 and upper ends of the surface mount devices including a capacitor 52a, a resistor 52b, a transistor 52c, and a coil 52d, and space is also required to accommodate the thickness T of the metal case 56, there is a problem in that the height of the resulting product is increased to a greater extent than the surface mount devices by a distance including the gap G and the thickness T.

Furthermore, since a gap in the horizontal direction between the metal case 56 and the surface mount devices including a capacitor 52a, a resistor 52b, a transistor 52c, and a coil 52d is also required, a mountable area in the electronic component base plate 51 for the surface mount devices is decreased. This prevents miniaturization of the resulting product.

Therefore, since the above-mentioned gap G and the thickness T of the metal case 56 are required, even if a thinner electronic component base plate 51 and smaller surface mount devices including a capacitor 52a, a resistor 52b, a transistor 52c, and a coil 52d alone are provided, it is still difficult to sufficiently reduce the height of the electronic component module.

When an electronic component module 61a shown in FIG. 12 is used, which includes surface mount devices that are sealed in a molded resin 57, a mountable area (plane area) for the surface mount devices is increased as compared to when the metal case is used. However, since a top surface 57a of the molded resin 57 is higher than upper ends of the surface mount devices, there is still a problem in that the height of the resulting product is greater than the surface mount devices by the distance D, i.e., the distance between the top surface 57a of the molded resin 57 and the upper ends of the surface mount devices.

SUMMARY OF THE INVENTION

To overcome the problems described above, preferred embodiments of the present invention provide a method for mounting an electronic component module in which a suction head can provide a suction force and hold the electronic component module, the electronic component module can be efficiently mounted on a target board, and the height of the electronic component module mounted on the target board can be sufficiently reduced, and also provide a method for manufacturing an electronic apparatus utilizing the above-mentioned method, and an electronic component module that can sufficiently reduce the height of the electronic component module mounted on the target board.

A preferred embodiment of the present invention provides a method for mounting an electronic component module including the steps of providing a suction surface member such that a suction surface that is arranged so as to be held with a suction head is formed on a side of a surface of the electronic component module including an electronic component base plate and a surface mount device mounted on the surface at a location higher than that of upper ends of surface mount devices; holding the electronic component module by providing a suction force to the suction surface with the suction head, and mounting the electronic component module on a target board; and after mounting the electronic component module on the target board, removing or reshaping the suction surface member to prevent an arrangement in which an upper end of the suction surface member is higher than the upper ends of the surface mount devices mounted on the electronic component base plate.

Preferably, the step of removing or reshaping the suction surface member, which is preferably made of an organic material member, includes at least one of the steps of eliminating the organic material member by heating, reducing the volume of the organic material member by heating, and reshaping the organic material member by heating without changing the volume thereof.

Preferably, when the electronic component module is mounted on a target board having solder paste printed thereon and is bonded to the target board by reflow soldering, a step of melting solder in the solder paste printed on a surface of the target board and a step of removing or reshaping the above-mentioned suction surface member are preferably performed in one operation as a step of reflow soldering performed in a process of soldering the electronic component module on the target board.

Preferably, the suction surface member is in a solid state prior to the reflow soldering step, and is preferably vaporized, liquefied, softened, or reduced in volume at the soldering temperature during the reflow soldering step.

The suction surface member is preferably made of naphthalene.

Preferably, a plurality of surface mount devices are mounted on the electronic component base plate and the suction surface is formed at a location higher than that of an upper end of the tallest surface mount device among the plurality of surface mount devices.

A method for manufacturing an electronic apparatus according to a preferred embodiment of the present invention includes a step of mounting the electronic component module on the target board with the method described above.

An electronic component module according to another preferred embodiment of the present invention includes an electronic component module including an electronic component base plate and a surface mount device mounted on the electronic component base plate, wherein, at a side of a surface of the electronic component module having the surface mount devices mounted thereon, a suction surface member is provided to define a suction surface that is held a suction force of the suction head, the suction surface member being in a solid state at a location that is higher than that of upper ends of the surface mount devices, and the suction surface member is vaporized, liquefied, softened, or reduced in volume at a melting temperature of solder used in solder bonding.

Preferably, a plurality of surface mount devices are mounted on an electronic component base plate and a suction surface is formed at a location higher than that of an upper end of the tallest surface mount device among the plurality of surface mount devices.

In the method for mounting the electronic component module according to preferred embodiments of the present invention, at a side of a surface of the electronic component module having surface mount devices disposed thereon, which includes an electronic component base plate and surface mount devices mounted on the electronic component base plate, a suction surface member is arranged such that a suction surface, which is held by a suction force of a suction head, is disposed at a location that is higher than a location of upper ends of the surface mount devices. Then the suction surface of the suction surface member is held by a suction head and the electronic component module is held so as to be placed on a target board. Then, in order to prevent the situation in which the upper end of the suction surface member is higher than the upper ends of the surface mount devices mounted on the electronic component base plate, the suction surface member is removed or reshaped. Therefore, when the electronic component module is being mounted, by using the suction head which applies a suction force to the suction surface of the suction surface member, the electronic component module can be held with ease and certainty and can be efficiently mounted with an automatic mounter or other suitable device. Furthermore, after mounting, the situation in which the upper end of the suction surface member is higher than the upper ends of the surface mount devices mounted on the electronic component base plate is effectively prevented, so that the height of a resulting product is reduced to a maximum extent possible.

Note that, after mounting the electronic component module on the target board, if the height of the suction surface is substantially equal to the height of the upper end of the tallest surface mount device, there is no need to lower the upper end of the adsorption face member, i.e., the location of the suction surface. In such a case, a treatment for removing or reshaping the suction surface member is not limited.

Examples of the suction surface member include organic material members, such as resins, that are vaporized, liquefied, softened, or reduced in volume by heating.

An example of a material that can be vaporized by heating is naphthalene.

Naphthalene is a material having sublimation properties, which changes its phase from a solid to a gas without passing through a liquid phase, and is preferably used as the suction surface member of preferred embodiments of the present invention.

An example of a material with sublimation properties is paradichlorobenzene.

Here, an example of the suction surface member of the present invention is a material which changes its phase to a gas passing through a liquid phase can also be used instead of a material with sublimation properties.

Furthermore, as the suction surface member according to preferred embodiments of the present invention, a resin that is reducible (shrinkable) in volume by heating, for example, a resin shrinkable by polymerization or a resin including gaseous bubbles that are released when heated resulting in the reduction of the volume thereof can be used.

Furthermore, as a material that cannot be removed or does not shrink, a heat-liquefiable (fusible) or heat-softenable material such as a synthetic resin, a natural resin, or a glass composition can be used. That is, a material, which is fluidized through fusing or softening by heating and can prevent a situation in which the upper end of the suction surface member is higher than the upper ends of surface mount devices mounted on electronic component base plate, can be used.

Furthermore, if the suction surface member is an organic material, as a step of removing or reshaping the organic material, by using at least one method selected from among methods that involve (a) eliminating the organic material member by heating, (b) reducing a volume of the organic material member by heating, and (c) reshaping the organic material member by heating without changing the volume thereof, the situation, in which the upper end of the suction surface member is higher than the upper ends of the surface mount devices mounted on the electronic component base plate, can be effectively prevented.

Note that, as an example of the above-mentioned method that involves (a) eliminating the organic material member by heating, a method that involves volatilizing or sublimating, i.e., vaporizing, the entire portion of the organic material member is used. However, other methods that include dissolving and removing an entire portion of organic material member with a solvent can be used.

Note that, as the above-mentioned method that includes (b) reducing a volume of the organic material member by heating, examples include a method that includes volatilizing or sublimating a portion of the organic material member and a method that includes a resin which reduces the volume thereof by heating. There are, however, other methods, for example, a method that includes dissolving and removing a portion of the organic material member with a solvent, can be used. Here, in preferred embodiments of the present invention, the method that includes reducing the volume of an organic material member by heating is an aspect of the concept of "reshaping of an adsorption surface member" of preferred embodiments of the present invention.

Furthermore, as an example of the above-mentioned method that involves (c) reshaping the organic material member by heating without changing the volume thereof, a method that involves softening or fusing (liquefying) the organic material member so as to change the shape thereof is given. However, other methods can be used.

Here, when the electronic component module is disposed on the target board, which has solder paste printed thereon and is bonded to the target board with solder by reflow soldering, if a step of melting solder in the solder paste, which is printed on the surface of the target board, and a step of removing or reshaping the above-mentioned suction surface member are performed in one operation as a step of reflow soldering, which is performed in a process of soldering the electronic component module on the target board, a treatment to prevent the situation in which the upper end of the suction surface member is higher than the upper ends of the surface mount devices mounted on the electronic component base plate can be performed without any additional step. This makes preferred embodiments of the present invention more advantageous. Note that, for mounting the electronic component module, although a soldering method that involves reflow soldering is preferably used, another soldering method that involves flow-soldering can be also used.

Furthermore, if such a material that exists in a solid state until a step before reflow soldering, that is, until the last process in which the material is mounted and then vaporized, liquefied, softened, or reduced in volume at the soldering temperature during reflow soldering, is used, the suction surface member is removed, reduced in volume, or reshaped in the reflow soldering step so as to effectively prevent the situation in which the upper end of the suction surface member is higher than the upper ends of the surface mount devices mounted on the electronic component base plate. This makes preferred embodiments of the present invention more advantageous.

Note that, when deformation of the suction surface member occurs during storage or transportation of the electronic component module, suction using the suction head cannot be performed during mounting. Therefore, during the storage or transportation, the suction surface member is preferably in a solid state. That is, it is preferable that the suction surface member is stably in a solid state when the temperature is in the assurance range (generally from about 50° C. to about 80° C., for example) of the electronic component module.

Furthermore, if a member composed of naphthalene is used as the suction surface member, for example, during reflow soldering in which the electronic component module is bonded to the target board with solder, the suction surface member can be removed or reduced in volume with ease, and the situation in which the upper end of the suction surface member is higher than the upper ends of the surface mount devices mounted on the electronic component base plate can be effectively prevented. This makes preferred embodiments of the present invention more advantageous.

Naphthalene is a material having a melting point of about 81° C., a boiling point of about 217° C., and sublimation properties. The melting point of naphthalene is higher than assurance temperatures of ordinary electronic component modules and naphthalene is vaporized at the reflow temperature. Therefore, naphthalene can be preferably used as the suction surface member.

Furthermore, when a plurality of surface mount devices are mounted on the electronic component base plate and the suction surface is formed at a location that is higher than the upper end of the tallest surface mount device among the plurality of surface mount devices, since none of the surface mount devices among the plurality of surface mount devices obstruct the operation of the suction head, the suction head can be securely adhered to the suction surface.

In preferred embodiments of the present invention, however, the location at which the suction surface is formed is not limited to the location that is higher than that of the upper end of the tallest surface mount device. The suction surface can be formed at a location that is lower than that of the upper end of the tallest surface mount device.

For example, when the tallest surface mount device is mounted on a portion of a surface of the electronic component base plate and other surface mount devices, which are shorter than the tallest surface mount device, are mounted on a main portion of the surface thereof, if the suction surface is disposed at a location that is higher than that of the upper ends of the surface mount devices mounted on the main portion, the suction head can be adhered to the suction surface without any problems even though the location of the upper end of the tallest surface mount device is higher than that of the suction surface.

Therefore, by using preferred embodiments of the present invention, a height of the suction surface member and an area where the suction surface member is formed can be determined according to a given condition, that is, a surface having surface mount devices of the electronic component module can be formed into any shape.

Furthermore, since the method for manufacturing an electronic apparatus according to preferred embodiments of the present invention having a step of mounting an electronic component module on a target board, such as a motherboard, includes the method for mounting an electronic component module according to preferred embodiments of the present invention, the electronic component module can be securely held by the suction head, and then, the electronic component module can be mounted on the target board. Therefore, electronic apparatuses with electronic component modules can be efficiently manufactured, so that productivity can be improved and electronic apparatuses having economical advantages can be provided.

Furthermore, at a side of a surface of the electronic component module of the present invention having surface mount devices thereon, the suction surface, which is provided for being held by the suction head, is formed in a solid state at a location higher than that of upper ends of the surface mount devices. The suction surface has a suction surface member which is vaporized, liquefied, softened, or reduced in volume at the melting temperature of the solder used in solder bonding. Therefore, by holding the suction surface of the suction surface member with the suction head, the electronic component module can be efficiently mounted using an automatic mounter or other suitable device. Furthermore, for example, when the suction surface member is mounted using the method of reflow soldering, the suction surface member thereof can be removed, reduced in volume, or reshaped by reflow soldering with ease so as to efficiently prevent the situation in which the upper end of the suction surface member is higher than the upper ends of surface mount devices mounted on the electronic component base plate.

Therefore, electronic component modules that can be used in the mounting method according to preferred embodiments of the present invention can be provided.

Furthermore, since a plurality of surface mount devices are mounted on the electronic component base plate and the suction surface is formed at a location that is higher than the upper end of the tallest surface mount device among the plurality of surface mount devices, none of the surface mount devices among the plurality of mounted surface mount devices obstruct the operation of the suction head and the suction head can securely apply a suction force to the suction surface. This makes preferred embodiments of the present invention more advantageous.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention are described below with reference to the drawings.

First Preferred Embodiment

Figure 1:
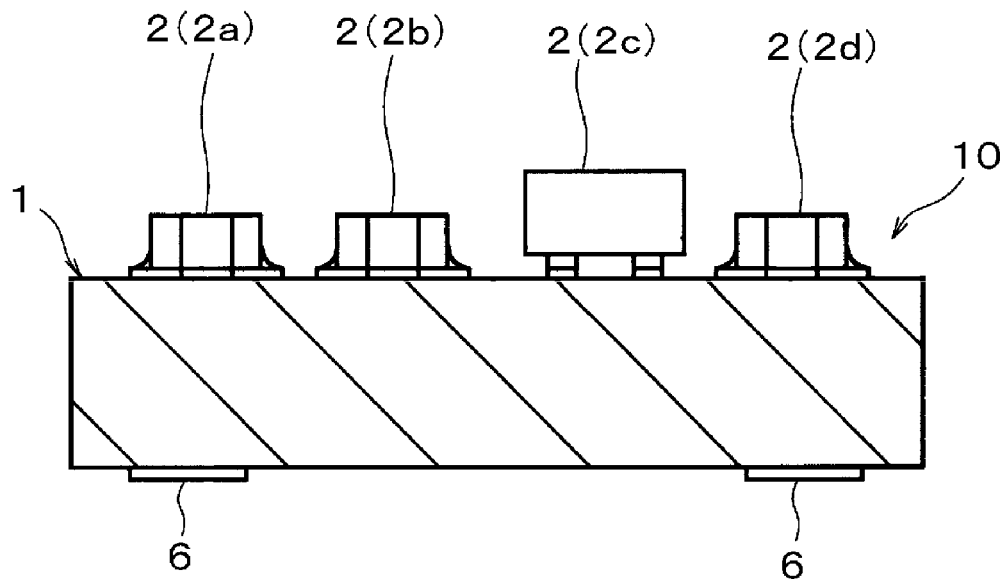
FIG. 1 shows a main body of an electronic component module in accordance with a first preferred embodiment of the present invention.

As shown in FIG. 1, an electronic component module main body 10 is prepared which includes surface mount devices 2 (for example, a capacitor 2a, a resistor 2b, a transistor 2c, a coil 2d) mounted on an upper surface of an electronic component base plate 1 (ceramic board in this preferred embodiment) having terminal electrodes 6 disposed on a lower surface thereof to be connected to a motherboard defining a target board.

Figure 2:
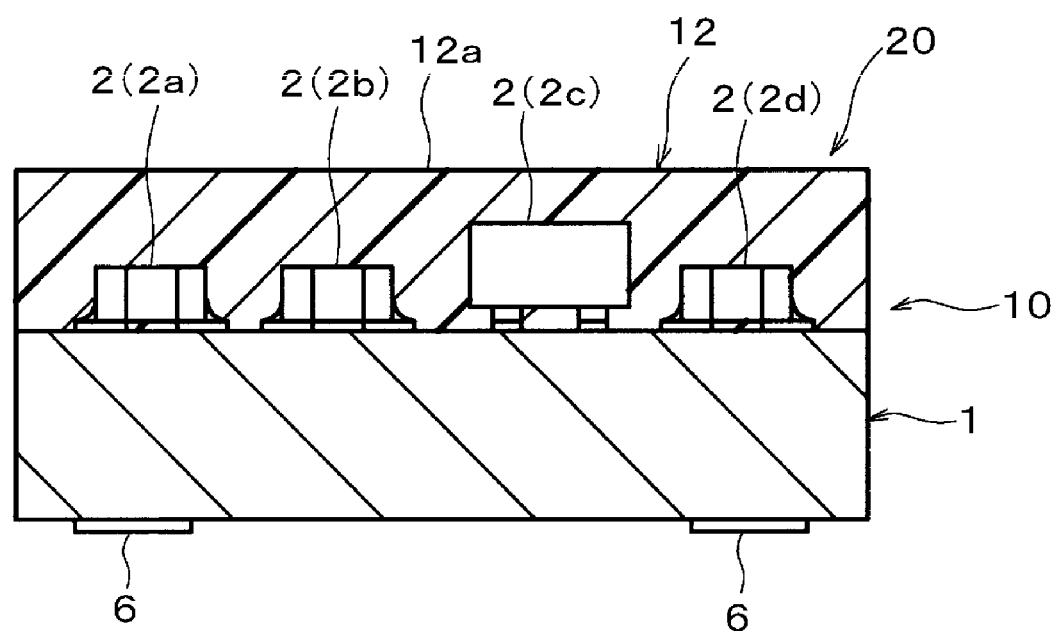
FIG. 2 shows the electronic component module in accordance with the first preferred embodiment of the present invention.

Then, naphthalene ($C_{10}H_8$), which is an aromatic hydrocarbon, in a liquid state is poured onto a surface of the electronic component module main body 10 having the surface mount devices 2 mounted thereon. After being solidified, a surface, or an upper surface of the solidified naphthalene shown in FIG. 2 is polished and flattened to define a suction surface member 12 having a suction surface 12a that is arranged to be held by a suction head. In such a manner, as shown in FIG. 2, an electronic component module 20 including the suction surface member 12 is arranged to define the suction surface 12a, which is held by a suction head 13 (refer to FIG. 3), at a location higher than that of an upper end of a transistor 2c, which is the tallest surface mounted device at a side of a surface including the surface mount devices 2 (a capacitor 2a, a resistor 2b, a transistor 2c, and a coil 2d) mounted thereon is obtained. Note that, the naphthalene defining the suction surface member 12 of the electronic component module 20 is made of a material that exists in a solid state at about room temperature and at an assurance temperature for the electronic component module (for example, about 75° C.) and is vaporized during reflow soldering at a soldering temperature mentioned below. The suction surface member 12 is effectively removed during reflow soldering.

Figure 3:
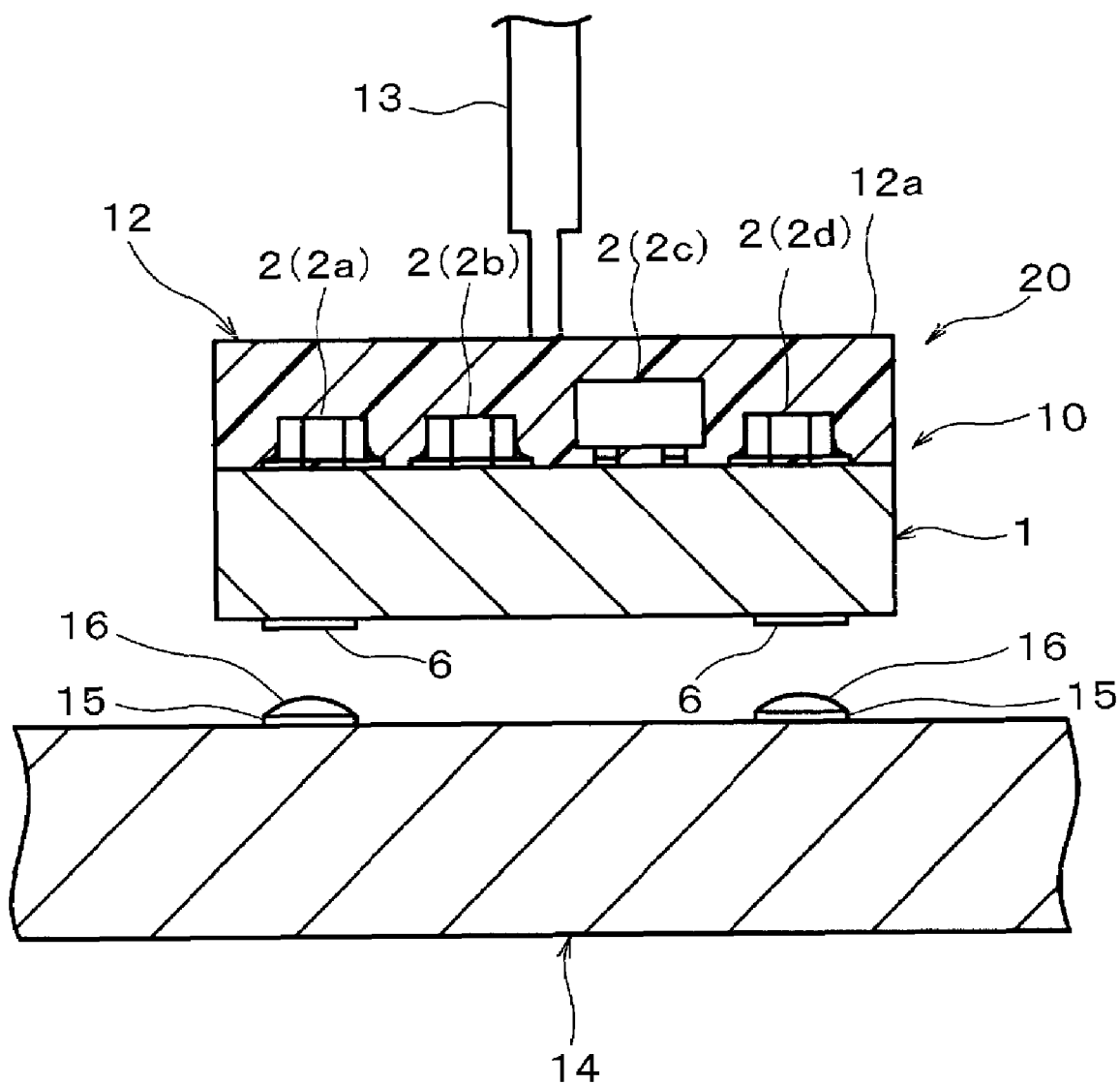
FIG. 3 shows a method for mounting the electronic component module in accordance with the first preferred embodiment of the present invention on a motherboard defining a target board by adsorbing and holding the electronic component module using a suction head.
Figure 4:
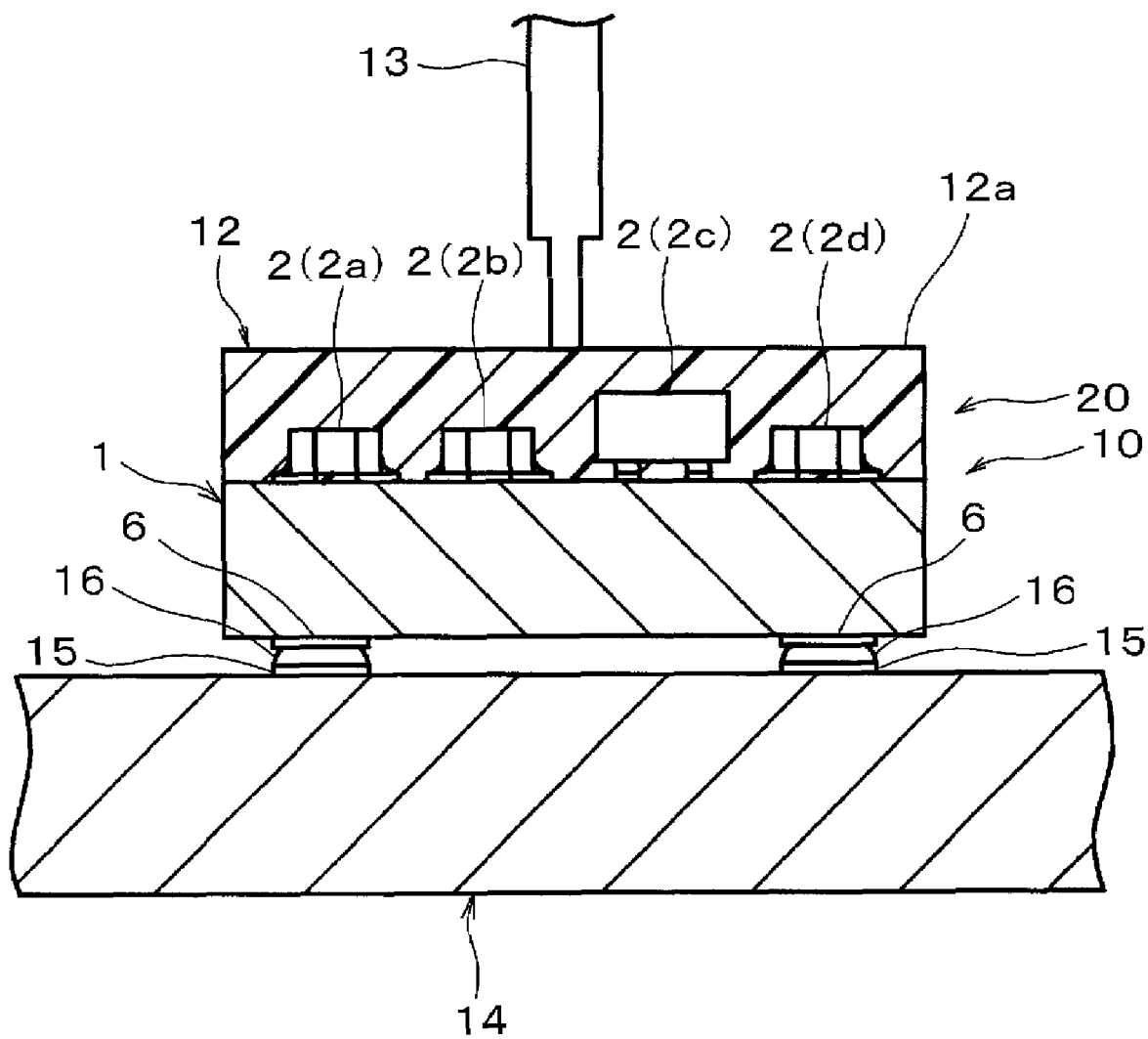
FIG. 4 shows a state of the mounted electronic component module in accordance with the first preferred embodiment of the present invention on a motherboard defining the target board by applying suction and holding the electronic component module using the suction head.

Next, as shown in FIGS. 3 and 4, by providing a suction force to the suction surface 12a of the electronic component module 20, the suction head 13 holds the electronic component module 20 and mounts the module 20 on a motherboard 14 defining the target board. Prior to this step, soldering paste 16 is printed on land electrodes 15 of the motherboard 14.

Figure 5:
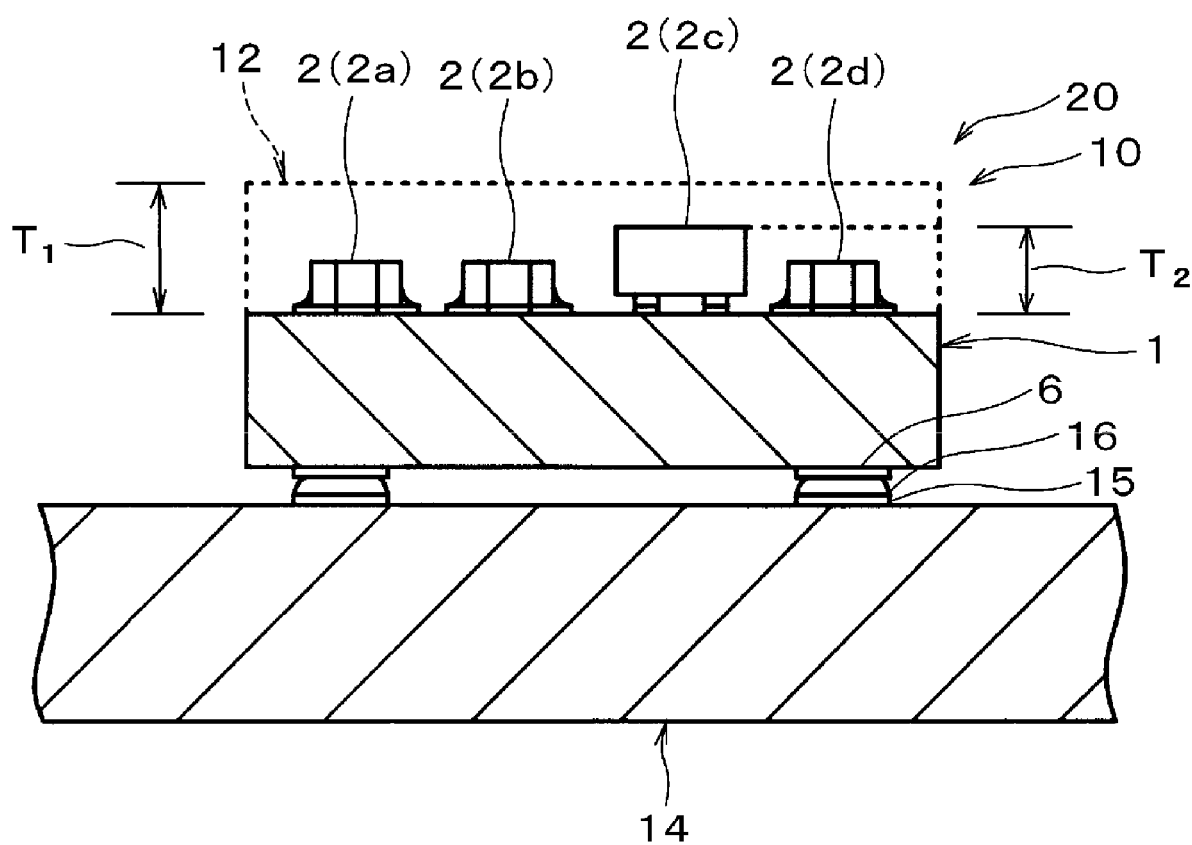
FIG. 5 is a view showing a state in which, after mounting the electronic component module in accordance with the first preferred embodiment of the present invention on the motherboard defining the target board by providing suction and holding the electronic component module using the suction head, a suction surface member is removed, which is performed to prevent a situation in which an upper end of the suction surface member is higher than an upper end of the tallest surface mount device mounted on the electronic component base plate.

Then, the suction from the suction head 13 is ceased. After moving the suction head 13 upwards, the electronic component module 20 on the motherboard 14 is fed into a reflow oven and heated at about 220° C. for about five minutes. Consequently, solder in the soldering paste 16 is melted and, as shown in FIG. 5, the terminal electrodes 6 on the electronic component module 20 are bonded and fixed to the land electrodes 15 of the motherboard 14 and, at the same time, the suction surface member 12 made of naphthalene is removed by vaporization.

As mentioned above, if the method for mounting an electronic component module according to the first preferred embodiment is used for mounting, by using the suction head 13 which provides a suction force to the suction surface 12a of the suction surface member 12, the electronic component module 20 can be held with ease and certainty and can be efficiently mounted on the motherboard 14 with the suction head 13 of an automatic mounter or other suitable device.

Furthermore, since the suction surface member 12 is vaporized and effectively removed during reflow soldering in a mounting process, $T_1$ (FIG. 5), which is the height measured from the upper surface of the electronic component base plate 1 of the electronic component module 20 having the suction surface member 12 formed thereon, can be reduced to substantially the same height as the height $T_2$ of the transistor 2c which is the tallest surface mount device. Therefore, a large reduction in the height of the electronic component module is achieved.

Second Preferred Embodiment

Figure 6:
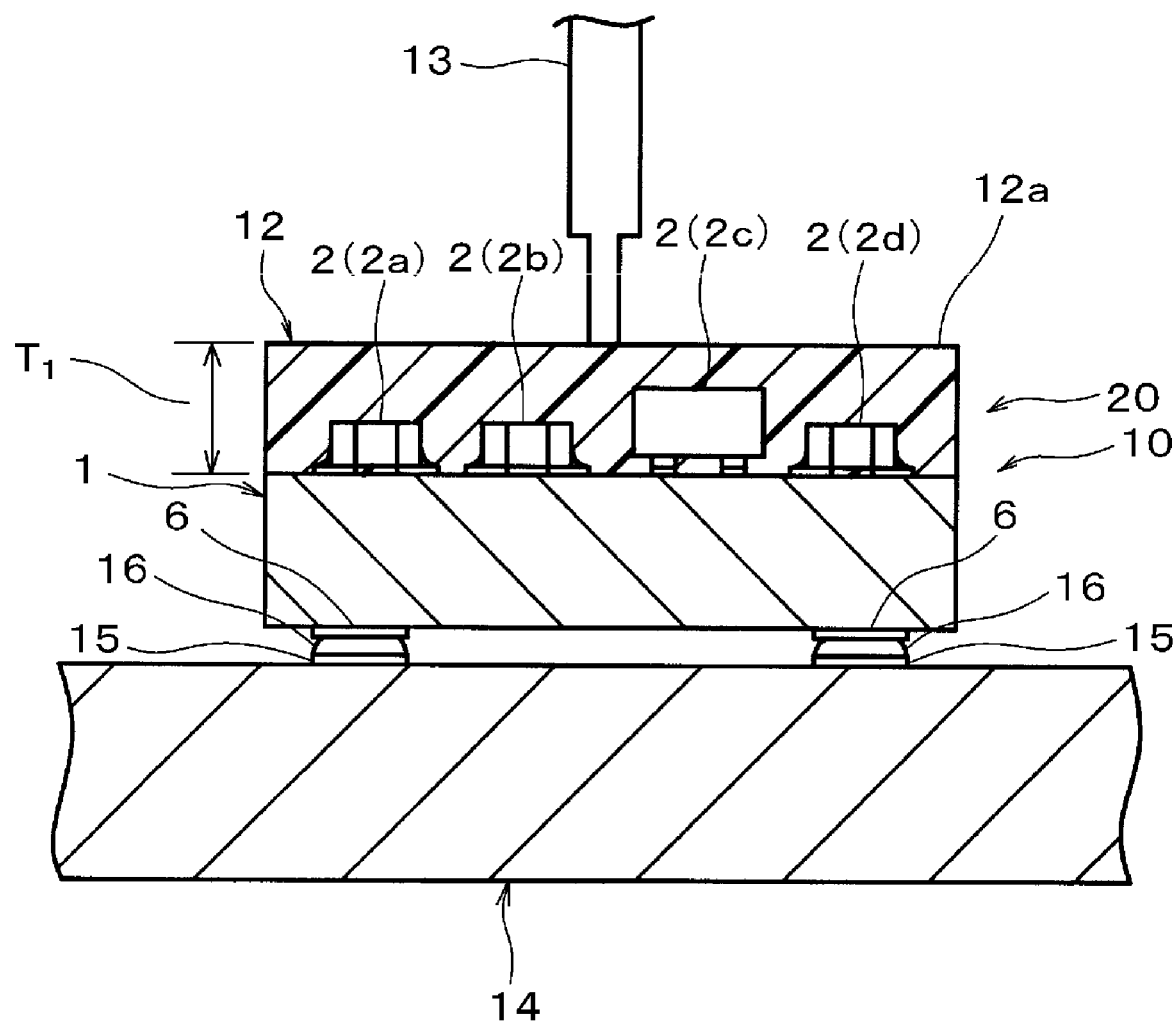
FIG. 6 shows an electronic component module in accordance with a second preferred embodiment of the present invention and shows a state in which the electronic component module is disposed on a motherboard defining a target board.
Figure 7:
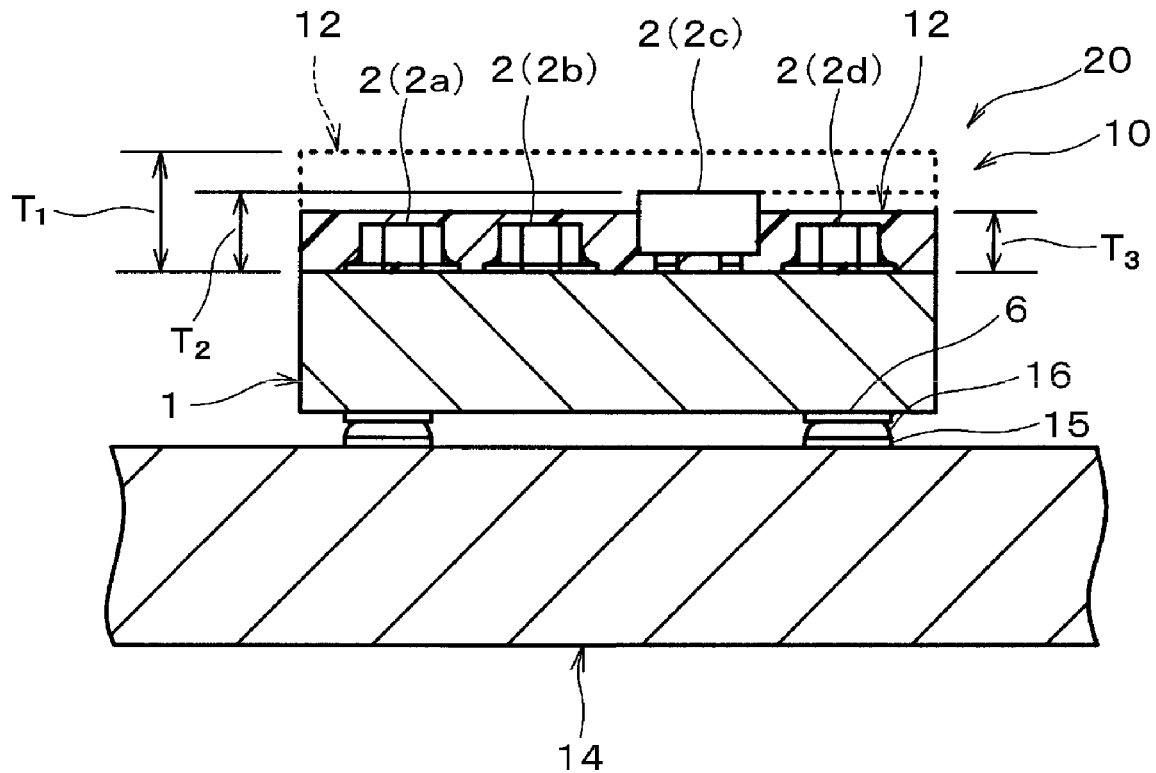
FIG. 7 shows a state in which, after mounting the electronic component module of the second preferred embodiment of the present invention on a motherboard, the suction surface member is reduced in volume, which is performed to prevent a situation in which an upper end of the suction surface member is higher than an upper end of the tallest surface mount device mounted on the electronic component base plate.

FIG. 6 shows an electronic component module 20 in accordance with a second preferred embodiment of the present invention and shows a state in which the electronic component module 20 is disposed on a motherboard. FIG. 7 shows a state in which the electronic component module 20 is mounted on a motherboard 14.

Note that, in FIGS. 6 and 7, the same reference numerals as used in FIGS. 1 to 5 denote the portions corresponding to those shown in FIGS. 1 to 5.

In the electronic component module 20 in accordance with the second preferred embodiment, a suction surface member 12 thereof is reduced in volume during reflow soldering, so that an upper end thereof is lower than an upper end of the transistor 2c, which is the tallest surface mount device mounted on an electronic component base plate 1.

Note that, according to the second preferred embodiment, the entire suction surface member 12 is not removed unlike in the first preferred embodiment. That is, the suction surface member 12 is reduced in volume, so that the upper end thereof is lower than the upper end of the transistor 2c, which is the tallest surface mount device mounted on the electronic component base plate 1. Except for this structure, the remaining structure, the manufacturing method, and the mounting method are substantially the same as described in the above-mentioned first preferred embodiment.

Note that, in the second preferred embodiment, naphthalene ($C_{10}H_8$) is used as the suction surface member 12.

Naphthalene is a material that sublimates when heated. Therefore, if the heating temperature or the heating time is increased, similar to the case in the above-mentioned first preferred embodiment, the entire suction surface member 12 will be vaporized so as to be completely eliminated. However, by controlling the temperature and time of heating, a portion of the suction surface member 12 is removed, and the other portion thereof remains. This is referred to as a reduction in volume.

Note that as a material for the suction surface member, which can be applied to the electronic component module 20 in accordance with the second preferred embodiment, that is, as a material that is reduced in volume during a reflow soldering step, a resin that is shrinkable by polymerization reaction or other suitable material, or a resin including gaseous bubbles that are released by deairing when heated resulting in a reduction in total volume can be used.

Furthermore, when the electronic component module 20 in accordance with the second preferred embodiment is fed into a reflow oven with the motherboard 14 for example, by heating under the condition of lower temperature than that of the above-mentioned first preferred embodiment, for example, about 200° C. and about five minutes, the volume of the suction surface member is reduced and the location of the upper surface thereof is lowered below that of the tallest surface mount device (transistor) 2c.

In the electronic component module 20 in accordance with the second preferred embodiment, after reflow soldering, the residue of the suction surface member 12 has a thickness of $T_3$ (FIG. 7). Since the thickness $T_3$ is less than the height $T_2$ of the tallest surface mount device (transistor) 2c, the height $T_1$ (FIG. 6) of the electronic component module 20 measured from the upper surface of the electronic component base plate 1 in a situation in which the suction surface member 12 is formed can be lowered, as shown in FIG. 7, to the height $T_2$ that is substantially the same height as the height of the transistor 2c of the tallest surface mount device.

Third Preferred Embodiment

Figure 8:
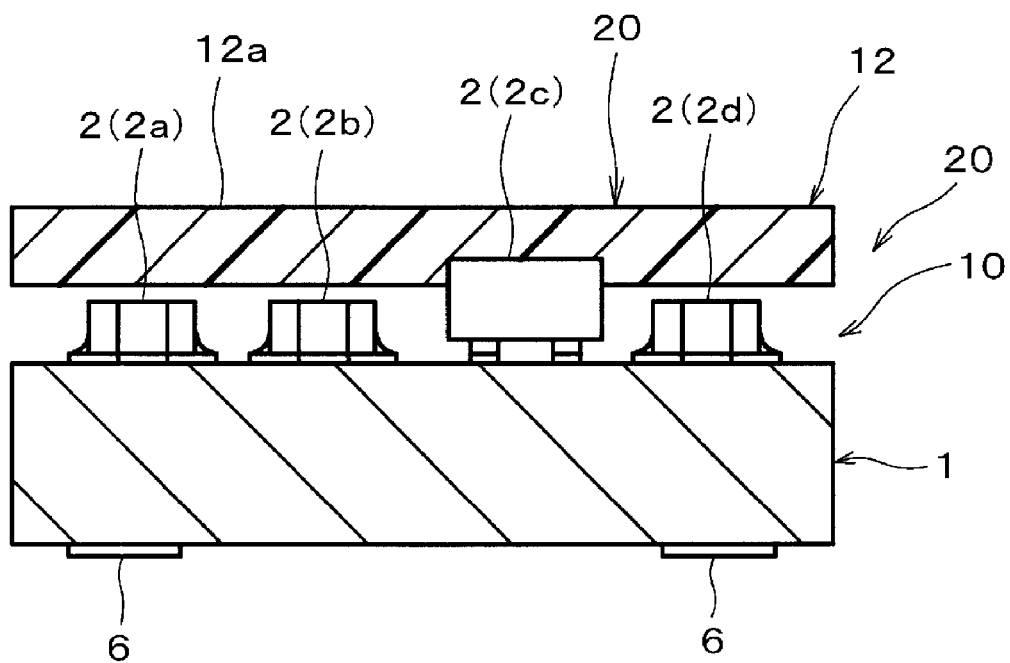
FIG. 8 shows an electronic component module in accordance with a third preferred embodiment of the present invention.
Figure 9:
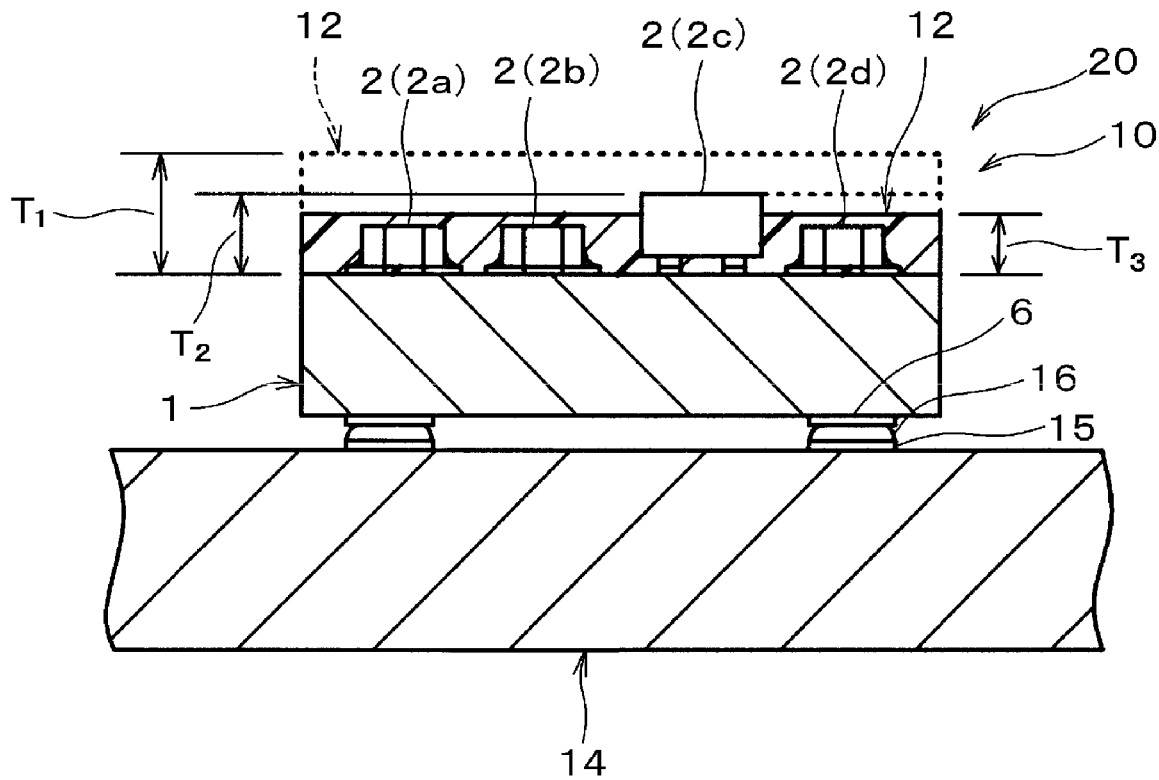
FIG. 9 shows a state in which, after mounting the electronic component module in accordance with the third preferred embodiment of the present invention on the motherboard, the suction surface member is reshaped, which is performed to prevent a situation in which an upper end of the suction surface member is higher than an upper end of the tallest surface mount device mounted on the electronic component base plate.

FIG. 8 is a view showing a structure of an electronic component module 20 in accordance with a third preferred embodiment of the present invention. FIG. 9 shows a state of the electronic component module 20 shown in FIG. 8, after being mounted on the motherboard 14.

Note that, in FIGS. 8 and 9, the same reference numerals as used in FIGS. 1 to 5 denote the portions corresponding to those shown in FIGS. 1 to 5.

In the electronic component module 20 in accordance with the third preferred embodiment, the suction surface member 12 thereof is made of a material that reshapes at the reflow temperature, so that a location of the upper end of the suction surface member 12 becomes lower than that of the transistor 2c, which is the tallest surface mount device, and is provided over the upper surface of the electronic component base plate 1 in a floating state so that the upper surface of the suction surface member 12 functions as a suction surface 12a for being held with the suction head.

Note that, the material the suction surface member 12 is a material which reshapes during reflow soldering and lowers the height of the upper end thereof. Except for the material, the structure of the electronic component module 20 in accordance with the third preferred embodiment, the manufacturing method, and the mounting method are same as those described with respect to the above-mentioned first preferred embodiment.

For the material used for the suction surface member 12 in the electronic component module 20 in accordance with the third preferred embodiment, various materials having higher melting points or softening points than the assurrance temperature thereof and lower than the reflow temperature, for example, β-naphthol (melting point, about 123° C.; boiling point, about 285° C.) may be used.

With the electronic component module 20 in accordance with the third preferred embodiment, during reflow soldering, the suction surface member 12 thereof reshapes to have a thickness of $T_3$ (FIG. 9). Since the thickness $T_3$ is less than the height $T_2$ of the tallest surface mount device (transistor) 2c, the height $T_1$ of the electronic component module 20 measured from the upper surface of the electronic component base plate 1 is reduced, as shown in FIG. 9, to the height $T_2$ that is substantially the same as the height of the tallest surface mount device (transistor) 2c.

Figure 10:
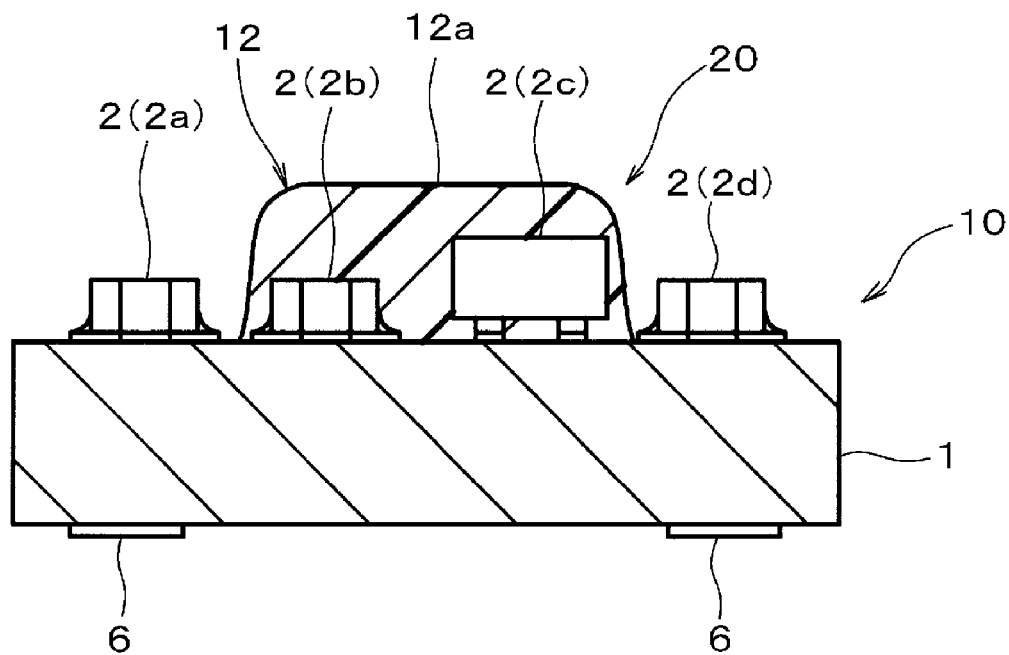
FIG. 10 shows an example of a modified electronic component module in accordance with the third preferred embodiment of the present invention.
Figure 11:
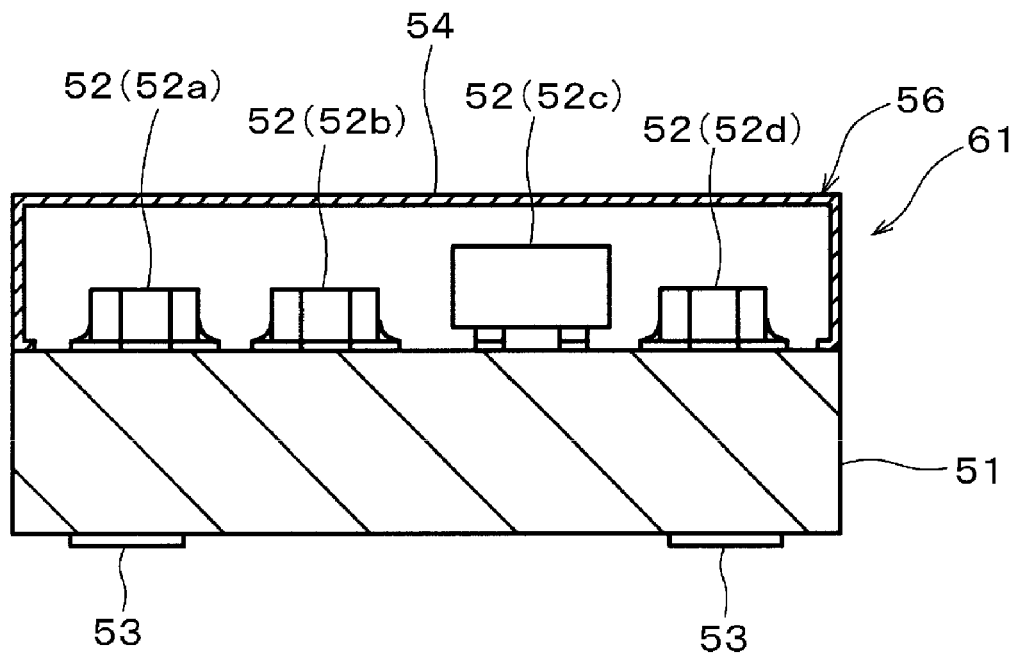
FIG. 11 shows a known electronic component module covered with a metal case that seals surface mount devices.
Figure 12:
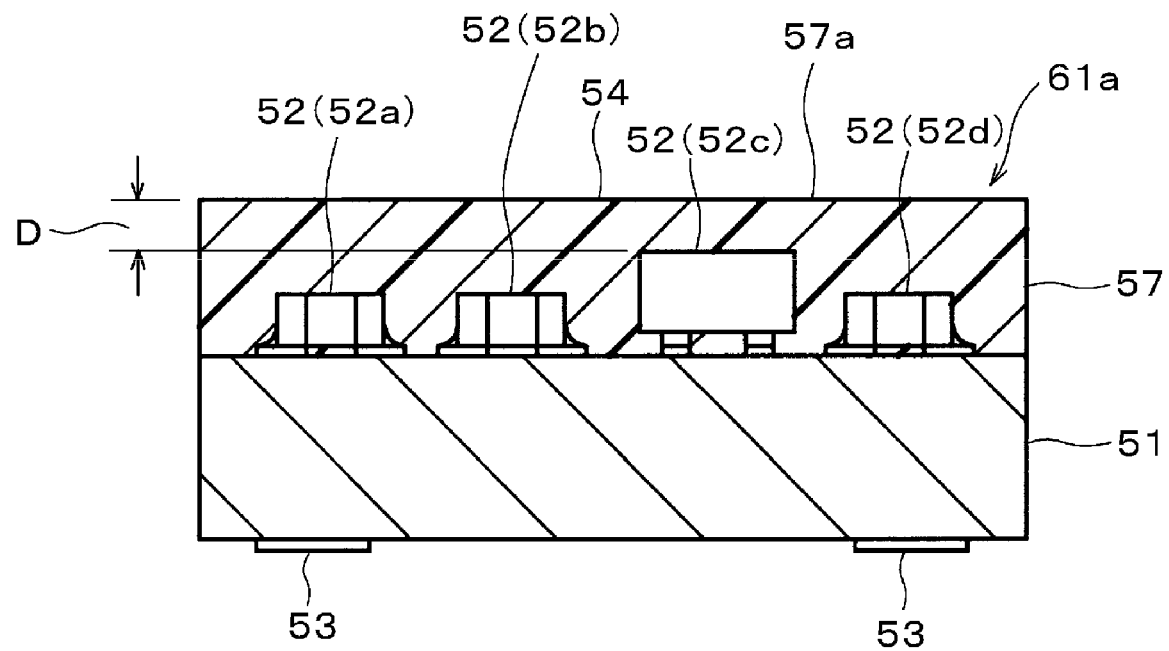
FIG. 12 shows a known electronic component module covered with a molded resin instead of the metal case that seals surface mount devices.
Figure 13:
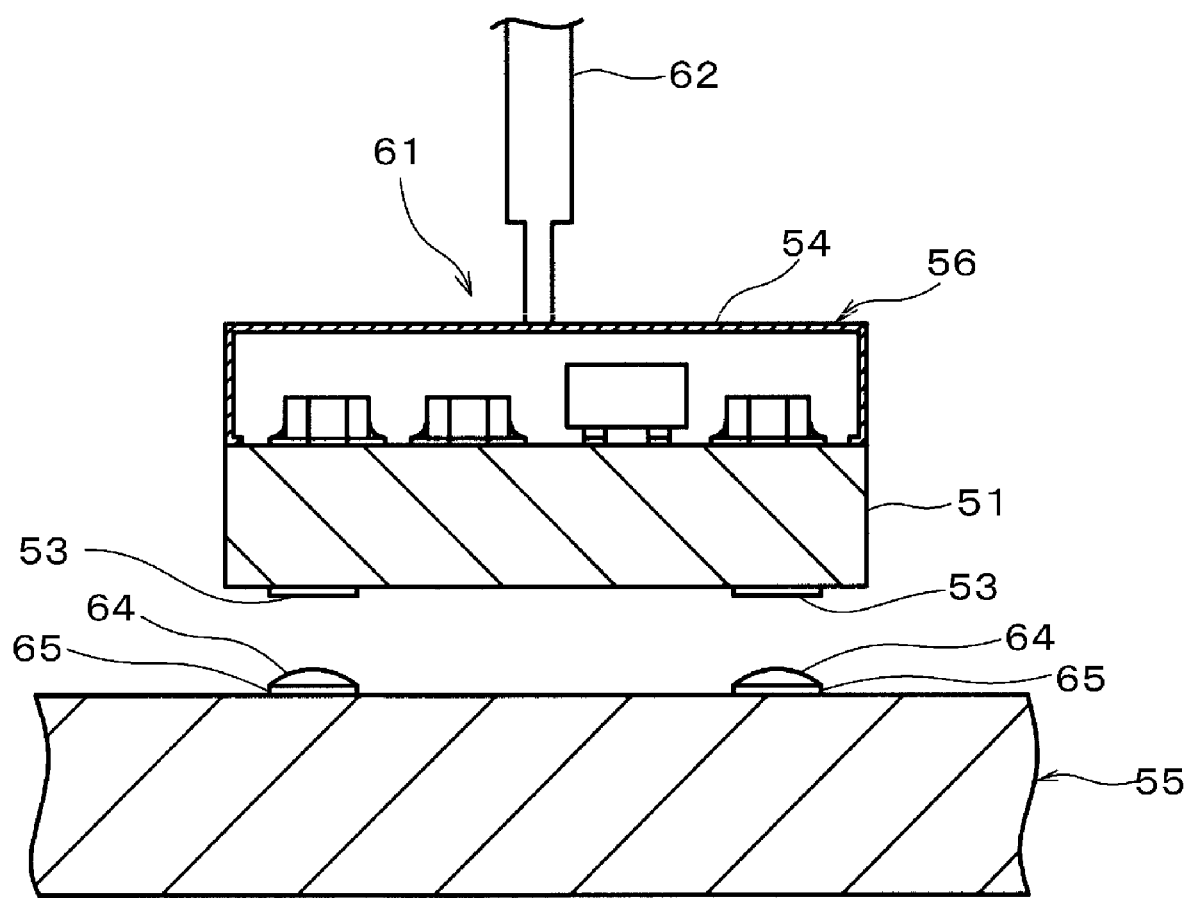
FIG. 13 shows a method for mounting a known electronic component module on a motherboard defining a target board.
Figure 14:
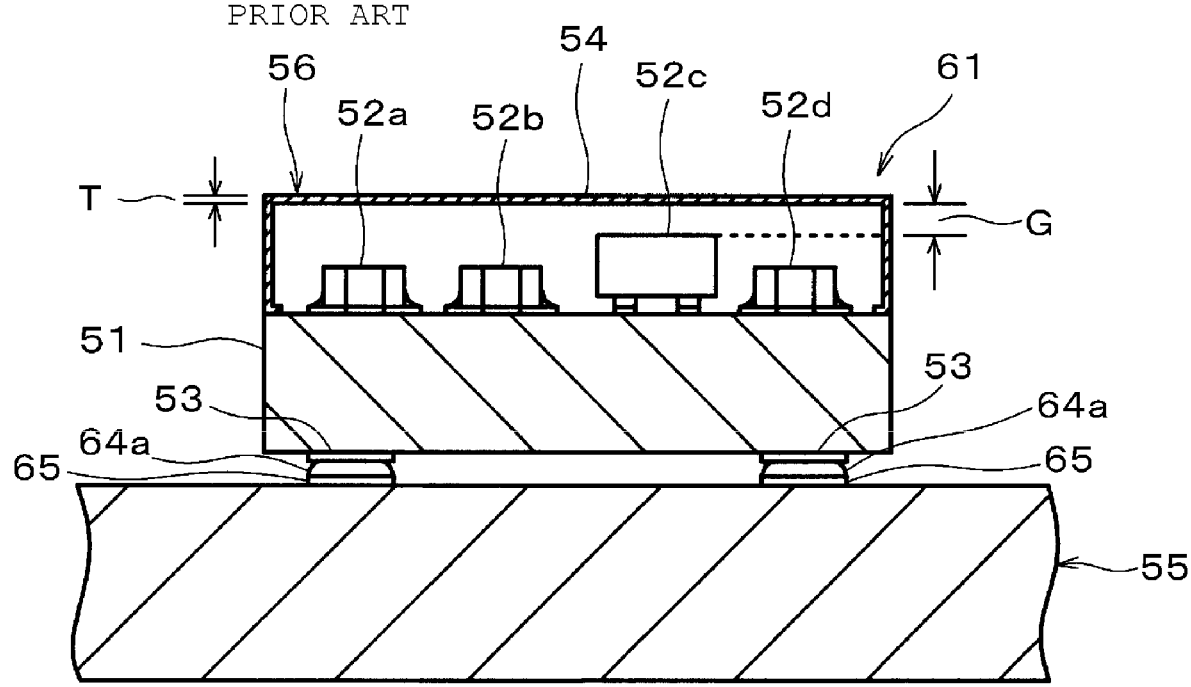
FIG. 14 is another view showing a method for mounting a known electronic component module on a motherboard defining a target board.

Note that the electronic component module including the suction surface member 12 made of a material that reshapes at a reflow temperature, so that a location of the upper end thereof becomes lower than that of the transistor 2c, which is the tallest surface mount device, is not limited to the module having a structure shown in the above-mentioned FIG. 8. As shown in FIG. 10, a structure may be provided in which the suction surface member 12 has a convex shape at the center portion of the electronic component base plate 1 so that the upper surface of the suction surface member 12 is higher than the transistor 2c, which is the tallest surface mount device, and functions as the suction surface 12a.

With the structure shown in FIG. 10, during reflow soldering, the suction surface member 12 thereof reshapes as shown in FIG. 9. Since the location of the upper end thereof becomes lower than the height $T_2$ of the tallest surface mount device, transistor 2c, the height $T_1$ of the electronic component module 20 measured from the upper surface of the electronic component base plate 1 can be lowered, as shown in FIG. 9, to the height $T_2$ that is substantially the same height as the height of the transistor 2c of the tallest surface mount device.

Note that the scope of the present invention is not limited to the above-mentioned preferred embodiments. Within the scope of the present invention, various applications and modifications can be made to prevent the situation in which the upper end of the suction surface member is higher than the upper ends of the surface mount devices, by changing the specific shape structure of the suction surface member, the method for forming an suction surface member, a structure of electronic component base plate defining the electronic component module, the type of surface mount devices mounted on the electronic component base plate, and by removing or reshaping the suction surface member.

As mentioned above, according to preferred embodiments of the present invention, in a mounting step, by using a suction head to apply a suction force to a suction surface of a suction surface member, an electronic component module can be held with ease and certainty and can be efficiently mounted with an automatic mounter. After the mounting step, since the upper surface of the suction surface member is effectively prevented from being higher than the upper ends of the surface mount devices mounted on the electronic component base plate, the maximum reduction in height of a resulting product is achieved.

Furthermore, if a treatment to prevent a situation in which the upper end of the suction surface member is higher than the upper ends of the surface mount devices mounted on the electronic component base plate and reflow soldering, which is performed in a process of soldering the electronic component module on the target board, are performed in one operation, the above-mentioned treatment can be performed without any additional steps.

Furthermore, by applying the method for mounting an electronic component module according to preferred embodiments of the present invention, electronic apparatuses provided with electronic component modules can be efficiently manufactured, so that productivity is improved.

Therefore, the present invention can be widely applied to various technical fields involving steps of mounting electronic component modules, particularly to a field of manufacturing electronic apparatuses provided with electronic component modules therein.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for mounting an electronic component module, comprising the steps of:
    providing a suction surface member such that a suction surface that is arranged to be held by a suction head is formed on a side of a surface of the electronic component module including an electronic component base plate and a surface mount device mounted on the surface at a location higher than that of an upper end of the surface mount device;
    holding the electronic component module by applying a suction force of the suction head to the suction surface, and mounting the electronic component module on a target board; and
    after mounting the electronic component module on the target board, removing or reshaping the suction surface member to prevent an arrangement in which an upper end of the suction surface member is higher than the upper end of the surface mount device mounted on the electronic component base plate.

2. The method for mounting the electronic component module according to claim 1, wherein the suction surface member is an organic material member and the step of removing or reshaping the suction surface member includes at least one of the steps of:
    (a) eliminating the organic material member by heating;
    (b) reducing a volume of the organic material member by heating; or
    (c) reshaping the organic material member by heating without changing the volume thereof.

3. The method for mounting the electronic component module according to claim 1, wherein when the target board includes solder paste printed thereon and the electronic component module is mounted and bonded to the target board by reflow soldering, a step of melting solder in the solder paste printed on a surface of the target board and a step of removing or reshaping the suction surface member are performed in one operation as a step of reflow soldering performed in a process of soldering the electronic component module on the target board.

4. The method for mounting the electronic component module according to claim 3, wherein the suction surface member is in a solid state prior to the reflow soldering step, and is vaporized, liquefied, softened, or reduced in volume at a soldering temperature during the reflow soldering step.

5. The method for mounting the electronic component module according to claim 1, wherein the suction surface member is made of naphthalene.

6. The method for mounting the electronic component module according to claim 1, wherein a plurality of the surface mount devices are mounted on the electronic component base plate and the suction surface is formed at a location that is higher than that of an upper end of a tallest surface mount device among the plurality of surface mount devices.

7. A method for manufacturing an electronic apparatus having an electronic component module on a target board, the method comprising a step of mounting the electronic component module on the target board by the method according to claim 1.

* * * * *